(12) United States Patent
Kim

(10) Patent No.: US 10,483,988 B1
(45) Date of Patent: Nov. 19, 2019

(54) SYNCHRONIZATION CIRCUIT AND METHOD RELATING TO THE SYNCHRONIZATION CIRCUIT

(71) Applicant: SK hynix Inc., Icheon-si, Gyeonggi-do (KR)

(72) Inventor: Tae Pyeong Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/224,603

(22) Filed: Dec. 18, 2018

(30) Foreign Application Priority Data

May 24, 2018 (KR) .................. 10-2018-0059173

(51) Int. Cl.
| H03L 7/08 | (2006.01) |
| H03L 7/18 | (2006.01) |
| H03L 7/181 | (2006.01) |
| H03L 7/081 | (2006.01) |
| G11C 7/22 | (2006.01) |
| G11C 7/10 | (2006.01) |

(52) U.S. Cl.
CPC .......... *H03L 7/0818* (2013.01); *G11C 7/1066* (2013.01); *G11C 7/222* (2013.01)

(58) Field of Classification Search
CPC ...... H03L 7/0818; G11C 7/1066; G11C 7/222
See application file for complete search history.

(56) References Cited

U.S. PATENT DOCUMENTS

| 6,727,738 | B2* | 4/2004 | Tsukikawa | G11C 7/22 |
| | | | | 327/160 |
| 7,167,035 | B2* | 1/2007 | Cao | H03L 7/0814 |
| | | | | 327/261 |
| 8,824,612 | B2* | 9/2014 | Ma | G11C 7/222 |
| | | | | 327/141 |
| 10,056,909 | B1* | 8/2018 | Qi | H03L 7/0818 |
| 2013/0265090 | A1* | 10/2013 | Ma | G11C 7/222 |
| | | | | 327/161 |

FOREIGN PATENT DOCUMENTS

KR 101213004 B1 12/2012

\* cited by examiner

*Primary Examiner* — Kenneth B Wells
(74) *Attorney, Agent, or Firm* — William Park & Associates Ltd.

(57) ABSTRACT

A synchronization circuit may include: a variable delay circuit configured to delay a first clock signal by a varied delay time according to delay control signals, and configured to output a delayed signal of the variable delay circuit as a second clock signal; a phase detector configured to generate a phase detection signal by detecting a phase difference between the first and second clock signals; and a delay control circuit configured to perform a phase unstable period detection operation according to the phase detection signal, and configured to perform a delay skip operation to adjust the delay control signals such that a phase unstable period, detected in the phase unstable period detection operation, is skipped in a delay time tuning operation.

25 Claims, 5 Drawing Sheets

SYNCHRONIZATION CIRCUIT AND METHOD RELATING TO THE SYNCHRONIZATION CIRCUIT

CROSS-REFERENCES TO RELATED APPLICATION

The present application claims priority under 35 U.S.C. § 119(a) to Korean application number 10-2018-0059173, filed on May 24, 2018, in the Korean Intellectual Property Office, which is incorporated herein by reference in its entirety.

BACKGROUND

1. Technical Field

Various embodiments generally relate to a semiconductor circuit, and more particularly, to a synchronization circuit and method relating to the synchronization circuit.

2. Related Art

A semiconductor device, for example, a semiconductor memory or a controller for controlling the semiconductor memory transfers output data with a clock signal synchronized with the output data, for example, a data strobe signal DQS.

The semiconductor device adjusts the phase of the clock signal to a desired value, and outputs data in synchronization with the clock signal.

For example, a delay-locked loop outputs a clock signal with a desired phase through a delay time tuning operation, and data are outputted in synchronization with the clock signal.

With the increase in frequency of the clock signal, the accuracy and speed of the delay time tuning operation may serve as important factors to determine the performance of a semiconductor device to which a synchronization circuit is applied.

SUMMARY

In an embodiment, a synchronization circuit may include: a variable delay circuit configured to delay a first clock signal by a varied delay time according to delay control signals, and configured to output a delayed signal of the variable delay circuit as a second clock signal; a phase detector configured to generate a phase detection signal by detecting a phase difference between the first and second clock signals; and a delay control circuit configured to perform a phase unstable period detection operation according to the phase detection signal, and configured to perform a delay skip operation to adjust the delay control signals such that a phase unstable period, detected in the phase unstable period detection operation, is skipped in a delay time tuning operation.

In an embodiment, a synchronization circuit may include: a first delay circuit configured to delay a first clock signal by a varied delay time according to a first delay control signal, and configured to output a delayed signal of the first delay circuit; a second delay circuit configured to delay the output signal of the first delay circuit by a varied delay time according to a second delay control signal, and configured to output a delayed signal of the second delay circuit as a second dock signal; a phase detector configured to generate a phase detection signal by detecting a phase difference between the first and second clock signals; a skip period information generation circuit configured to generate skip period information by performing a phase unstable period detection operation according to the phase detection signal; and a delay control signal generation circuit configured to adjust the second delay control signal according to the skip period information, such that a phase unstable period, detected in the phase unstable period detection operation, is skipped in a delay time tuning to operation.

In an embodiment, a method for operating a synchronization circuit may include: determining whether the current operation state of the synchronization circuit is a power-up sequence; performing a phase unstable period detection operation by controlling a second delay circuit when the current operation state is the power-up sequence; storing the number of unit delays of the second delay circuit corresponding to a phase unstable period, detected in the phase unstable period detection operation, as skip period information; and performing a delay time tuning operation by controlling a first delay circuit and the second delay circuit when the current operation state is not the power-up sequence. The second delay circuit may be controlled according to the skip period information such that the phase unstable period is skipped when performing the delay time tuning operation.

DETAILED DESCRIPTION

Hereinafter, a synchronization circuit according to the present disclosure will be described below with reference to the accompanying drawings through examples of embodiments.

Various embodiments may be directed to a synchronization circuit capable of raising the accuracy and speed thereof.

Figure 1:
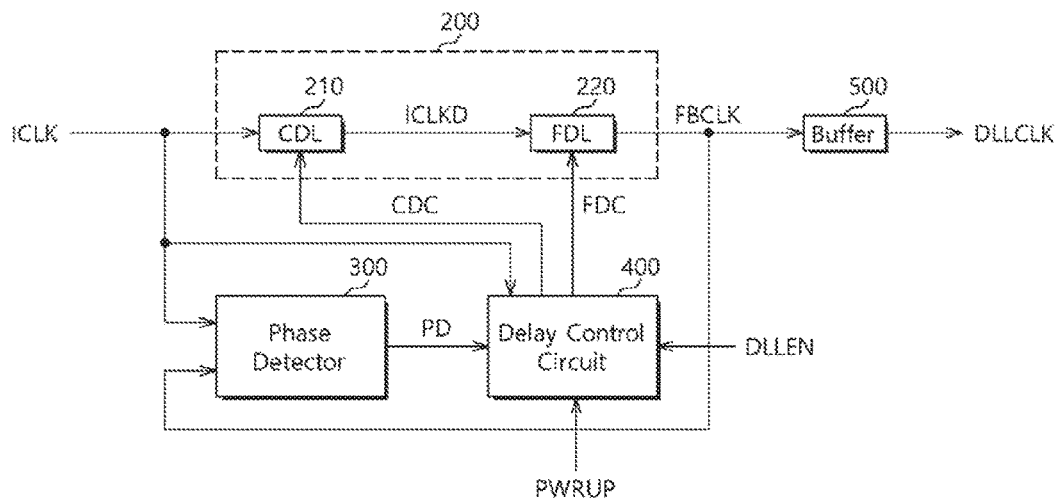
FIG. 1 illustrates the configuration of a synchronization circuit in accordance with an embodiment.

FIG. 1 illustrates the configuration of a synchronization circuit in accordance with an embodiment.

As illustrated in FIG. 1, the synchronization circuit 100 in accordance with an embodiment may include a variable delay circuit 200, a phase detector 300, a delay control circuit 400, and a buffer 500.

The variable delay circuit 200 may delay a first clock signal ICLK by a varied delay time according to delay control signals, i.e. first and second delay control signals CDC and FDC, and output the delayed signal as a second clock signal FBCLK.

The variable delay circuit 200 may include delay circuits, first and second delay circuits.

The first delay circuit may include a coarse delay line (CDL) 210, and the second delay circuit may include a fine delay line (FDL) 220.

The CDL 210 may be used for a first tuning operation of a delay time tuning operation, i.e. a coarse tuning operation.

The FDL 220 may be used for a second tuning operation of the delay time tuning operation, i.e. a fine tuning operation may have a smaller unit delay time than the coarse tuning operation.

The CDL 210 may generate an output signal ICLKD by delaying the first clock signal ICLK by a varied delay time, and provide the output signal ICLKD to the FDL 220.

The phase detector 300 may generate a phase detection signal PD by detecting a phase difference between the first and second clock signals ICLK and FBCLK.

The delay control circuit 400 may receive a power-up signal PWRUP, the first clock signal ICLK, the phase detection signal PD, and an enable signal DLLEN, and generate the delay control signals, i.e. the first and second delay control signals CDC and FDC.

The enable signal DLLEN may be generated at each predetermined time interval in a system including the synchronization circuit 100.

Specifically, the enable signal DLLEN may be generated at each predetermined time interval during a power-up sequence and a normal operation period in the system including the synchronization circuit 100.

The delay control circuit 400 may perform the delay time tuning operation during an active period of the enable signal DLLEN.

The delay control circuit 400 may generate the first and second delay control signals CDC and FDC according to the phase detection signal PD to tune the delay time of the variable delay circuit 200 in order to perform the delay time tuning, i.e. the coarse and/or fine tuning.

The delay control circuit 400 may perform the coarse tuning, and determine that the coarse tuning has been completed when a coarse lock is detected. Furthermore, the delay control circuit 400 may perform the fine tuning, and determine that the fine tuning has been completed when a fine lock is detected.

The delay control circuit 400 may determine whether the phase detection signal PD transitions, in order to detect the coarse lock or the fine lock.

For example, when the phase detection signal PD transitions from '0' to '1' during the coarse tuning process, the delay control circuit 400 may determine that the coarse lock was detected. The detection of the fine lock may be determined in the same manner.

The delay control circuit 400 may perform the coarse tuning while increasing the number of unit delays of the CDL 210 one by one, with the unit delays being used for the coarse tuning. When a coarse lock is detected, the delay control circuit 400 may decrease the number of unit delays of the CDL 210 by one, and then perform the fine tuning using the unit delays of the FDL 220.

The delay control circuit 400 may perform a phase unstable period detection operation while performing the delay time tuning operation according to the phase detection signal PD.

The delay control circuit 400 may perform an operation of adjusting the delay control signal, such that a detected phase unstable period (i.e. a phase unstable period detected in the phase unstable detection operation) is skipped in the delay time tuning operation. Hereafter, the operation will be referred to as a delay skip operation.

At this time, the delay skip operation may include an operation of adjusting the first delay control signal CDC and/or the second delay control signal FDC, such that unit delays (i.e. unit delays of the CDL 210 and/or unit delays of the FDL 220) corresponding to the detected phase unstable period are skipped in the delay time tuning operation.

The delay control circuit 400 may determine the power-up sequence of the synchronization circuit 100, i.e. the system including the synchronization circuit 100 according to the power-up signal PWRUP.

The delay control circuit 400 may determine the power-up sequence according to edge information (rising edge or falling edge) of the power-up signal PWRUP.

The delay control circuit 400 may perform the phase unstable period detection operation while performing the delay time tuning operation according to the phase detection signal PD, in the case of the power-up sequence (i.e. when the current operation state is the power-up sequence).

When the current state is not the power-up sequence, the delay control circuit 400 might not perform the phase unstable period detection operation, but perform the delay skip operation using the result of the previous phase unstable period detection operation. In an embodiment, the delay control circuit 400 may perform the phase unstable period detection operation prior to the performance of the delay skip operation.

The phase unstable period detection operation may include a plurality of phase detection operation sets.

The plurality of phase detection operation sets may be performed by differently setting or increasing the delay time of the variable delay circuit 200 according to the order of the phase detection operation sets. For example, when the plurality of phase detection operation sets are performed, the delay time of the variable delay circuit 200 may be differently set for each of the phase detection operation sets.

Each of the phase detection operation sets may include a plurality of phase detections which are performed while the delay time of the variable delay circuit 200 is fixed.

The buffer 500 may receive the second clock signal FBCLK, and output the received signal as a delay-locked loop (DLL) clock signal DLLCLK.

Figure 2:
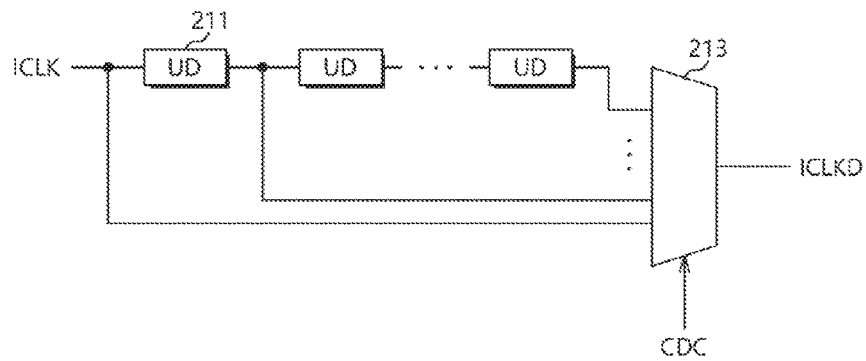
FIG. 2 illustrates the configuration of a coarse delay line of FIG. 1 in accordance with an embodiment.

FIG. 2 illustrates the configuration of the CDL of FIG. 1 in accordance with an embodiment.

As illustrated in FIG. 2, the CDL 210 may include first unit delays (UD) 211 and a multiplexer 213.

The first unit delays 211 may sequentially delay the first clock signal ICLK, and output the delayed signals.

The first unit delays 211 may be designed to have the same delay time. The first unit delays 211 may be configured to have substantially the same delay time.

The multiplexer 213 may select any one of the output signals of the first unit delays 211 according to the first delay control signal CDC, and generate the output signal ICLKD by delaying the first clock signal ICLK by a varied delay time.

Figure 3:
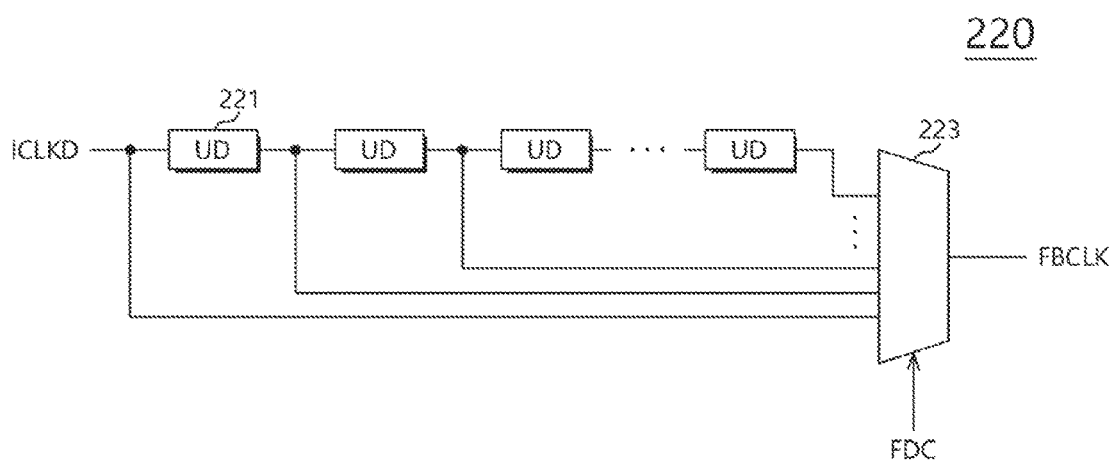
FIG. 3 illustrates the configuration of a fine delay line of FIG. 1 in accordance with an embodiment.

FIG. 3 illustrates the configuration of the FDL of FIG. 1 in accordance with an embodiment.

As illustrated in FIG. 3, the FDL 220 may include second unit delays (UD) 221 and a multiplexer 223.

The second unit delays 221 may sequentially delay the output signal ICLKD of the CDL 210, and output the delayed signals.

The second unit delays 221 may be designed to have the same delay time. The second unit delays 221 may be configured to have substantially the same delay time.

The multiplexer 223 may select any one of the output signals of the second unit delays 221 according to the second delay control signal FDC, and generate the second clock signal FBCLK by delaying the output signal ICLKD of the CDL 210 by a varied delay time.

The second unit delay 221 of the FDL 220 may be designed to have a smaller delay time than the first unit delay 211 of the CDL 210. The second unit delay 221 of the FDL 220 may be configured to have a smaller delay time than the first unit delay 211 of the CDL 210.

Figure 4:
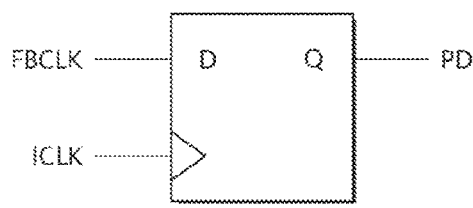
FIG. 4 illustrates the configuration of a phase detector of FIG. 1 in accordance with an embodiment.

FIG. 4 illustrates the configuration of the phase detector of FIG. 1 in accordance with an embodiment.

As illustrated in FIG. 4, the phase detector 300 may include a D flip-flop.

The D flip-flop may have an input terminal configured to receive the second clock signal FBCLK and a clock terminal configured to receive the first clock signal ICLK.

The D flip-flop may latch the second clock signal FBCLK according to the first clock signal ICLK, and output the latched signal as the phase detection signal PD.

Figure 5:
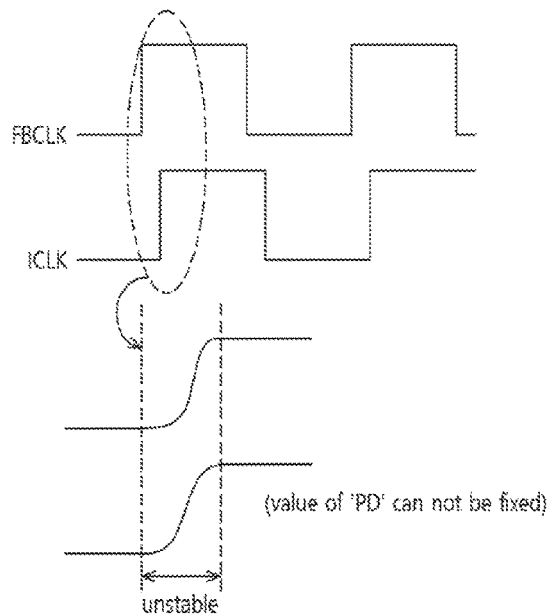
FIG. 5 illustrates an operation of the phase detector of FIG. 4 in accordance with an embodiment.

FIG. 5 is a waveform diagram illustrating the operation of the phase detector of FIG. 4 in accordance with an embodiment.

In FIG. 5, the waveforms at the top indicate the ideal waveforms of the first and second clock signals ICLK and FBCLK, and the waveforms at the bottom indicate the actual waveforms of the first and second clock signals ICLK and FBCLK in a rising edge period.

As illustrated at the bottom of FIG. 5, the phase detection signal PD based on the waveforms of the first and second clock signals ICLK and FBCLK in the rising edge period might not be fixed to either '0' or but may have any value of '0' or '1'. Thus, this period may be referred to as a phase unstable period.

While the delay time of the variable delay circuit 200 is fixed, the phase detection may be performed a plurality of times, and the phase unstable period may be detected according to whether the values of the phase detection signal PD, generated by the plurality of phase detections, coincide with each other.

Since the second unit delay 221 of the FDL 220 has a smaller delay time than the first unit delay 211 of the CDL 210, the accuracy and speed of the fine tuning may be reduced by the phase unstable period.

Therefore, the synchronization circuit 100 in accordance with an embodiment of the present disclosure may detect the phase unstable period, and perform the delay skip operation to skip the detected phase unstable period in the delay time tuning process (for example, the fine tuning process), which may make it possible to raise the operation accuracy and speed of the synchronization circuit 100.

Figure 6:
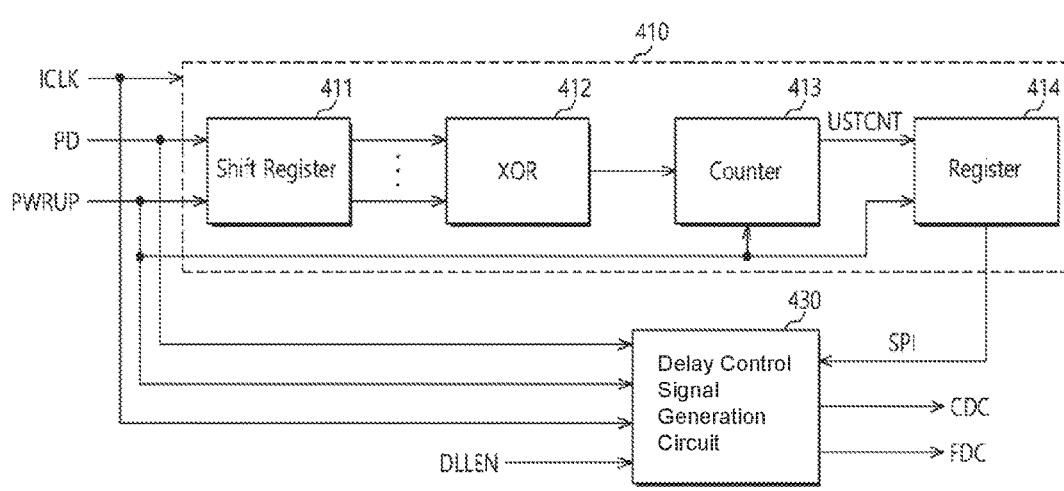
FIG. 6 illustrates the configuration of a delay control circuit of FIG. 1 in accordance with an embodiment.

FIG. 6 illustrates the configuration of the delay control circuit of FIG. 1 in accordance with an embodiment.

As illustrated in FIG. 6, the delay control circuit 400 may generate skip period information SPI for the delay skip operation by performing the phase unstable period detection operation according to the first clock signal ICLK and the phase detection signal PD.

The delay control circuit 400 may include a skip period information generation circuit 410 and a delay control signal generation circuit 430.

The skip period information generation circuit 410 may generate the skip period information SPI by performing the phase unstable period detection operation according to the first clock signal ICLK and the phase detection signal PD. In an embodiment, the skip period information generation circuit 410 may perform the phase unstable period detection operation by performing a plurality of phase detection operation sets.

The skip period information generation circuit 410 may reset the value of the skip period information SPI according to the power-up signal PWRUP.

The skip period information generation circuit 410 may include a shift register 411, a logic gate 412, a counter 413, and a register 414.

The shift register 411 may sequentially shift the phase detection signal PD, and output the shifted signals.

The shift register 411 may reset the output signals of the shift register 411 according to the power-up signal PWRUP.

The logic gate 412 may perform an XOR operation on the output signals of the shift register 411. The logic gate 412 may output a result of the XOR operation.

The counter 413 may generate a phase unstable period count signal USTCNT by counting an output signal of the logic gate 412.

The counter 413 may reset the phase unstable period count signal USTCNT according to the power-up signal PWRUP.

The register 414 may store the phase unstable period count signal USTCNT, and output the stored signal as the skip period information SPI.

The register 414 may reset the skip period information SPI according to the power-up signal PWRUP.

The delay control signal generation circuit 430 may perform the coarse tuning, and determine that the coarse tuning has been completed when a coarse lock is detected. Furthermore, the delay control signal generation circuit 430 may perform the fine tuning, and determine that the fine tuning has been completed when a fine lock is detected.

The delay control signal generation circuit 430 may receive the first clock signal ICLK, the power-up signal PWRUP, the phase detection signal PD, the skip period information SPI, and the enable signal DLLEN, and generate the first and second delay control signals CDC and FDC.

The delay control signal generation circuit 430 may perform the delay skip operation according to the skip period information SPI.

The delay control signal generation circuit 430 may differently set the delay times of the plurality of phase detection operation sets when the enable signal DLLEN is activated in the power-up sequence, and adjust the first and second delay control signals CDC and FDC such that the delay times of the respective phase detection operation sets are evenly maintained. For example, when the enable single DLLEN is activated in the power-up sequence, a first phase detection operation set may be performed by setting the delay time of the second delay circuit including FDL 220 to a first delay time via the delay control signal generation circuit 430, and then a second phase detection operation set may be performed by setting the delay time of the second delay circuit including FDL 220 to a second delay time via the delay control signal generation circuit 430. Furthermore, for example, the first phase detection operation set may include a plurality of phase detections which are performed while the delay time of the second delay circuit including FDL 220 is fixed to the first delay time via the second delay control signal FDC adjusted by the delay control signal generation circuit 430, and the second phase detection operation set may include a plurality of phase detections which are performed while the delay time of the second delay circuit including FDL 220 is fixed to the second delay time via the second delay control signal FDC adjusted by the delay control signal generation circuit 430.

When the enable signal DLLEN is activated in the other periods excluding the power-up sequence period, the delay control signal generation circuit 430 may perform the delay skip operation by adding the skip period information SPI to the initial value of the second delay control signal FDC.

In an embodiment, the delay control circuit 400 may include the skip period information generation circuit 410 and the delay control signal generation circuit 430, and the skip period information generation circuit 410 may include the shift register 411, the logic gate 412, the counter 413, and the register 414. However, this is only an example configuration, and the delay control signal generation circuit 430 may be implemented with a state machine, or the entire delay control circuit 400 may be implemented with a state machine.

Hereafter, the operation of the synchronization circuit in accordance with an embodiment of the present disclosure will be described.

Figure 7:
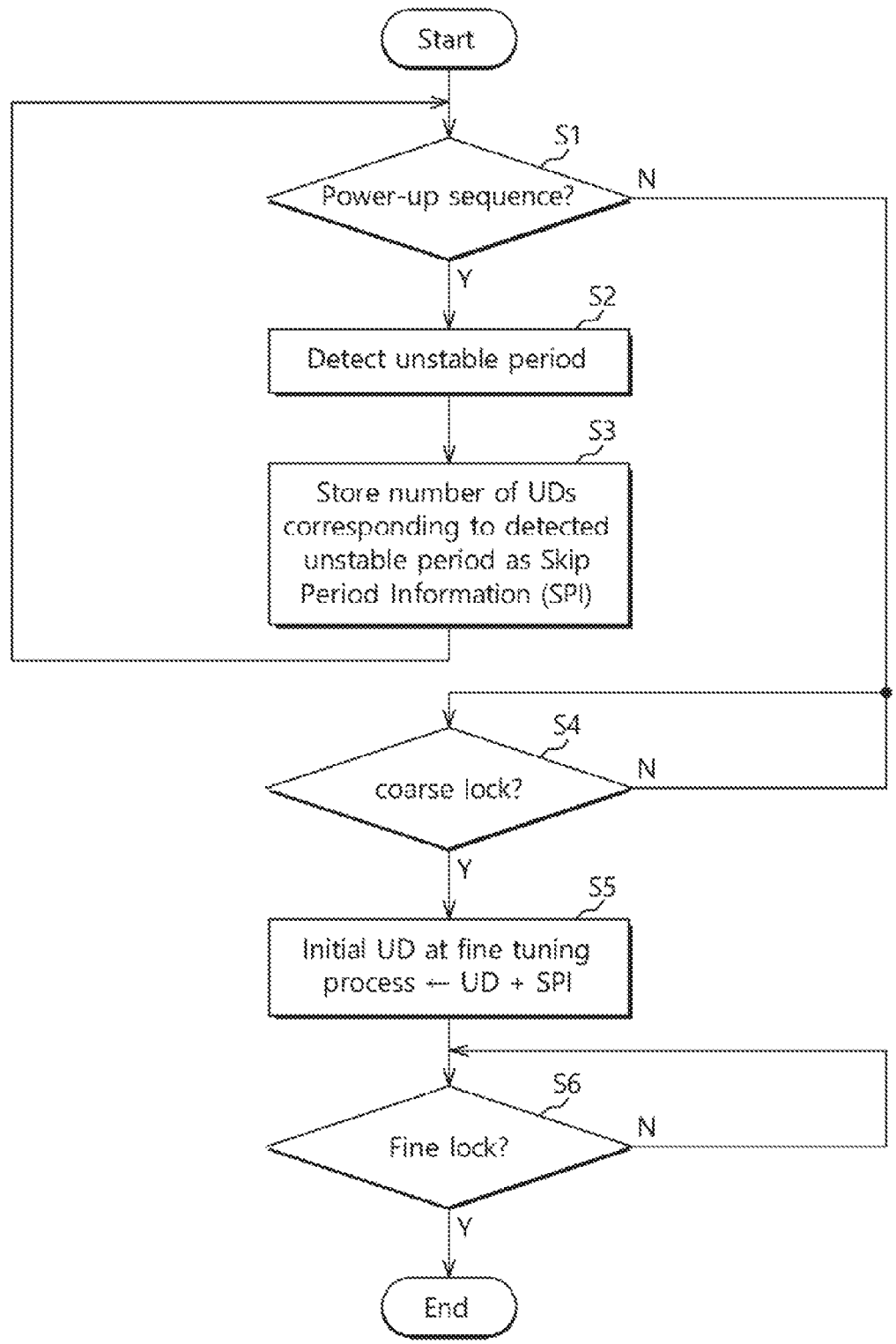
FIG. 7 is a flowchart illustrating an operation of the synchronization circuit in accordance with an embodiment.
Figure 8:
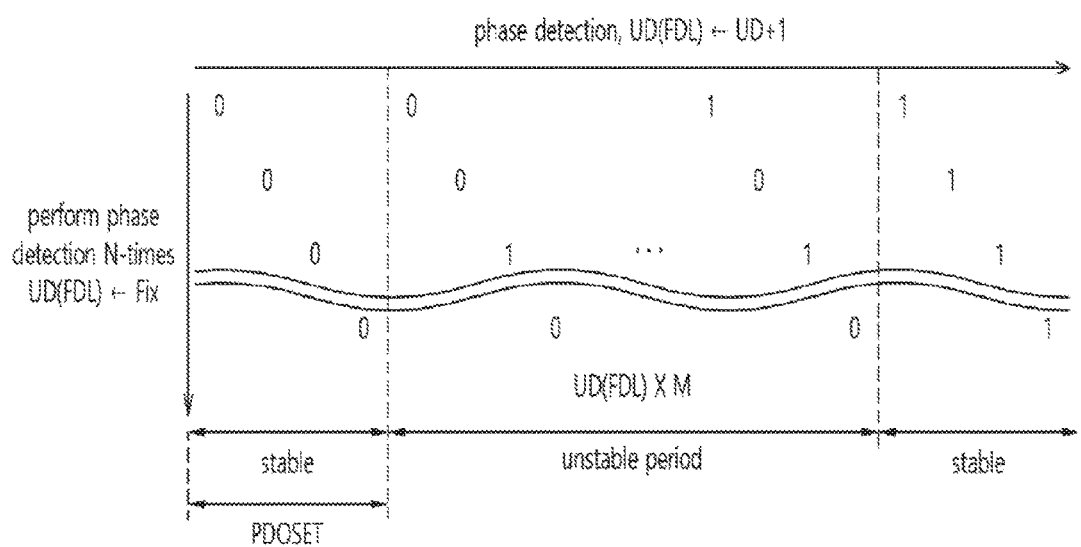
FIG. 8 illustrates a phase unstable period detection method of FIG. 7 in accordance with an embodiment.

FIG. 7 is a flowchart illustrating the operation of the synchronization circuit in accordance with an embodiment, and FIG. 8 illustrates a phase unstable period detection method of FIG. 7 in accordance with an embodiment.

Referring to FIG. 7, the synchronization circuit 100 may determine whether the current state is the power-up sequence, when the enable signal DLLEN is activated, at step S1.

The determination of the power-up sequence may be performed according to the edge information (rising edge or falling edge) of the power-up signal PWRUP.

When the determination result of step S1 indicates that the current state is the power-up sequence, the synchronization circuit 100 may perform the phase unstable period detection operation at step S2.

Referring to FIG. 8, the phase unstable period detection operation may include a plurality of phase detection operation sets in the fine tuning process which is performed by controlling the FDL 220 of FIG. 2, after a coarse lock is detected.

During the first phase detection operation set PDOSET, the phase detection may be performed N times (for example, five times), while the delay time of the FDL 220 is fixed without changing the second unit delays 221 [e.g. UD(FDL) ←Fix].

When the values of the N (e.g. five) phase detection signals PD coincide with each other (i.e. when all of the values are all '0' or all '1'), the corresponding period may be determined to be a phase stable period.

When the values of the N (e.g. five) phase detection signals PD coincide with each other, the logic gate 412 of FIG. 6 may output a low-level signal. Therefore, the value of the phase unstable period count signal USTCNT might not be increased but retained at a preset value (for example, '0').

Then, the delay time of the FDL 220 may be increased by one step [e.g. UD(FDL)←UD+1], i.e. the second unit delays 221 may be changed. While this state is maintained, the phase detection may be performed N times (for example, five times) to perform the second phase detection operation set.

When any one of the values of the N (e.g. five) phase detection signals PD has a different value, the corresponding period may be determined to be a phase unstable period. In an embodiment, when any one of the values of the N (e.g. five) phase detection signals PD has a different value, the corresponding phase detection operation set is detected as a phase unstable period by the skip period information generation circuit 410.

When any one of the N (e.g. five) phase detection signals PD has a different value, the logic gate 412 of FIG. 6 may output a high-level signal. Therefore, the phase unstable period count USTCNT may be increased.

After repeating the phase detection operation sets until the phase stable period is detected, the synchronization circuit 100 may complete the phase unstable period detection operation.

Then, the synchronization circuit 100 may store the number of second unit delays 221 (e.g. number of UDs) corresponding to the detected phase unstable period as the skip period information SPI at step S3.

For example, when M phase unstable periods are detected, it may indicate that the number of second unit delays 221 was increased by M [e.g. increased by UD(FDL)×M] during the phase unstable period.

In this case, the phase unstable period count signal USTCNT of FIG. 6 may have a value corresponding to 'M', and the register 414 may store the value of the phase unstable period count signal USTCNT, and output the stored value as the skip period information SPI.

When the determination result of step S1 indicates that the current state is not the power-up sequence, the synchronization circuit 100 may perform the normal delay time tuning operation, i.e. the coarse tuning, and determine whether a coarse lock is detected, at step S4.

When the determination result of step S4 indicates that a coarse lock was detected, the synchronization circuit 100 may increase the initial number of second unit delays 221 in the FDL 220 by the skip period information SPI at step S5 [e.g. initial UD at fine tuning process←UD+SPI].

Then, the synchronization circuit 100 may perform the fine tuning to determine whether a fine lock is detected, at step S6.

When the determination result of step S6 indicates that a fine lock is detected, the synchronization circuit 100 may determine that the fine tuning has been completed, and end the operation.

As described above, the synchronization circuit 100 in accordance with an embodiment of the present disclosure may skip the second unit delays 221 corresponding to the phase unstable period at the initial stage of the fine tuning, and select the second unit delay 221 corresponding to the next phase stable period in order to start the fine tuning.

Therefore, the synchronization circuit 100 may complete the delay time tuning operation faster than when the fine tuning is started by increasing the number of second unit delays 221 one by one. Furthermore, since the phase unstable period is skipped, the delay time tuning operation may be performed with more precision.

While various embodiments have been described above, it will be understood to those skilled in the art that the described embodiments are examples only. Accordingly, the operating method of a data storage device described herein should not be limited based on the described embodiments.

What is claimed is:

1. A synchronization circuit comprising:
    a variable delay circuit configured to delay a first clock signal by a varied delay time according to delay control signals, and configured to output a delayed signal of the variable delay circuit as a second clock signal;
    a phase detector configured to generate a phase detection signal by detecting a phase difference between the first and second clock signals; and
    a delay control circuit configured to perform a phase unstable period detection operation according to the phase detection signal, and configured to perform a delay skip operation to adjust the delay control signals according to skip period information such that a phase unstable period, detected in the phase unstable period detection operation, is skipped in a delay time tuning operation, wherein the delay control circuit includes a skip period information generation circuit configured to generate the skip period information by performing the phase unstable period detection operation according to the phase detection signal.

2. The synchronization circuit according to claim 1, wherein the variable delay circuit comprises:
   a first delay circuit comprising first unit delays; and
   a second delay circuit comprising second unit delays configured to have a smaller delay time than the first unit delays of the first delay circuit.

3. The synchronization circuit according to claim 2, wherein the first delay circuit comprises:
   the first unit delays configured to sequentially delay the first clock signal and to output delayed signals of the first unit delays; and
   a multiplexer configured to generate an output signal by selecting any one of the delayed signals of the first unit delays according to a first delay control signal among the delay control signals.

4. The synchronization circuit according to claim 2, wherein the second delay circuit comprises:
   the second unit delays configured to sequentially delay the output signal of the first delay circuit and to output delayed signals of the second unit delays; and
   a multiplexer configured to generate an output signal by selecting any one of the delayed signals of the second unit delays according to a second delay control signal among the delay control signals.

5. The synchronization circuit according to claim 1, wherein the delay control circuit performs the phase unstable period detection operation when the current operation state of the synchronization circuit is a power-up sequence.

6. The synchronization circuit according to claim 5, wherein the delay control circuit recognizes the power-up sequence according to edge information of a power-up signal.

7. The synchronization circuit according to claim 5, wherein when the current operation state of the synchronization circuit is not the power-up sequence, the delay control circuit performs the delay skip operation using a result of the phase unstable period detection operation performed prior to the performance of the delay skip operation.

8. The synchronization circuit according to claim 1,
   wherein the delay control circuit performs the phase unstable period detection operation by performing a plurality of phase detection operation sets,
   wherein the plurality of phase detection operation sets are performed by differently setting the varied delay time of the variable delay circuit for each of the phase detection operation sets, and
   wherein each of the phase detection operation sets includes a plurality of phase detections which are performed while the varied delay time of the variable delay circuit is fixed.

9. The synchronization circuit according to claim 8, wherein when any one result of the plurality of phase detections has a different value from any other result of the plurality of phase detections, the delay control circuit detects the corresponding phase detection operation set as a phase unstable period.

10. The synchronization circuit according to claim 1, wherein the skip period information generation circuit comprises:
    a shift register configured to sequentially shift the phase detection signal and to output the shifted signals;
    a logic gate configured to perform a logic operation on the output signals of the shift register, and configured to output the logic operation result;
    a counter configured to generate a phase unstable period count signal by counting the output signal of the logic gate; and
    a register configured to store the phase unstable period count signal.

11. A synchronization circuit comprising:
    a first delay circuit configured to delay a first clock signal by a varied delay time according to a first delay control signal, and configured to output a delayed signal of the first delay circuit;
    a second delay circuit configured to delay the output signal of the first delay circuit by a varied delay time according to a second delay control signal, and configured to output a delayed signal of the second delay circuit as a second clock signal;
    a phase detector configured to generate a phase detection signal by detecting a phase difference between the first and second clock signals;
    a skip period information generation circuit configured to generate skip period information by performing a phase unstable period detection operation according to the phase detection signal; and
    a delay control signal generation circuit configured to adjust the second delay control signal according to the skip period information, such that a phase unstable period, detected in the phase unstable period detection operation, is skipped in a delay time tuning operation.

12. The synchronization circuit according to claim 11, wherein second unit delays of the second delay circuit are configured to have a smaller delay time than first unit delays of the first delay circuit.

13. The synchronization circuit according to claim 11, wherein the first delay circuit comprises:
    first unit delays configured to sequentially delay the first clock signal and to output delayed signals of the first unit delays; and
    a multiplexer configured to generate an output signal by selecting any one of the delayed signals of the first unit delays according to the first delay control signal.

14. The synchronization circuit according to claim 11, wherein the second delay circuit comprises:
    second unit delays configured to sequentially delay the output signal of the first delay circuit and to output delayed signals of the second unit delays; and
    a multiplexer configured to generate an output signal by selecting any one of the delayed signals of the second unit delays according to the second delay control signal.

15. The synchronization circuit according to claim 11, wherein the skip period information generation circuit comprises:
    a shift register configured to sequentially shift the phase detection signal and to output the shifted signals;
    a logic gate configured to perform a logic operation on the output signals of the shift register, and configured to output the logic operation result;
    a counter configured to generate a phase unstable period count signal by counting the output signal of the logic gate; and a register configured to store the phase unstable period count signal, and configured to output the stored signal as the skip period information.

16. The synchronization circuit according to claim 15, wherein the output signals of the shift register, the phase unstable period count signal, and the skip period information are reset according to a power-up signal.

17. The synchronization circuit according to claim 11, wherein the delay control signal generation circuit performs the phase unstable period detection operation when the current operation state of the synchronization circuit is a power-up sequence.

18. The synchronization circuit according to claim 17, wherein the delay control signal generation circuit recognizes the power-up sequence according to edge information of a power-up signal.

19. The synchronization circuit according to claim 17, wherein when the current operation state of the synchronization circuit is not the power-up sequence, the delay control signal generation circuit adds the skip period information value to the initial value of the second delay control signal.

20. The synchronization circuit according to claim 11, wherein the skip period information generation circuit performs the phase unstable period detection operation by performing a plurality of phase detection operation sets,
wherein the plurality of phase detection operation sets are performed by differently setting the varied delay time of the second delay circuit for each of the phase detection operation sets, and
wherein each of the phase detection operation sets includes a plurality of phase detections which are performed while the varied delay time of the second delay circuit is fixed.

21. The synchronization circuit according to claim 20, wherein when any one result of the plurality of phase detections has a different value from any other result of the plurality of phase detections, the skip period information generation circuit detects the corresponding phase detection operation set as a phase unstable period.

22. A method for operating a synchronization circuit, the method comprising:
determining whether the current operation state of the synchronization circuit is a power-up sequence;
performing a phase unstable period detection operation by controlling a second delay circuit when the current operation state is the power-up sequence;
storing the number of unit delays of the second delay circuit corresponding to a phase unstable period, detected in the phase unstable period detection operation, as skip period information; and
performing a delay time tuning operation by controlling a first delay circuit and the second delay circuit when the current operation state is not the power-up sequence,
wherein the second delay circuit is controlled according to the skip period information such that the phase unstable period is skipped when performing the delay time tuning operation.

23. The method of claim 22, wherein the unit delays of the second delay circuit are configured to have a smaller delay time than unit delays of the first delay circuit.

24. The method of claim 22,
wherein the performing of the phase unstable period detection operation includes performing a plurality of phase detection operation sets,
wherein the plurality of phase detection operation sets are performed by differently setting a delay time of the second delay circuit for each of the phase detection operation sets, and
wherein each of the phase detection operation sets includes a plurality of phase detections which are performed while the delay time of the second delay circuit is fixed.

25. The method of claim 24, wherein when any one result of the plurality of phase detections has a different value from any other result of the plurality of phase detections, the corresponding phase detection operation set is detected as a phase unstable period.

* * * * *